United States Patent
Cho et al.

(10) Patent No.: US 9,520,634 B2
(45) Date of Patent: Dec. 13, 2016

(54) RESONANCE DEVICE

(71) Applicant: Innertron, Inc., Namdong-gu, Incheon (KR)

(72) Inventors: Hak-Rae Cho, Incheon (KR); Soo-Duk Seo, Incheon (KR); Jeong-Pyo Kim, Seoul (KR)

(73) Assignee: Innertron, Inc., Incheon (KR)

( * ) Notice: Subject to any disclaimer, the term of this patent is extended or adjusted under 35 U.S.C. 154(b) by 126 days.

(21) Appl. No.: 14/039,594

(22) Filed: Sep. 27, 2013

(65) Prior Publication Data

US 2014/0306782 A1    Oct. 16, 2014

(30) Foreign Application Priority Data

Apr. 12, 2013  (KR) .................. 10-2013-0040613

(51) Int. Cl.
| | |
|---|---|
| *H01P 1/203* | (2006.01) |
| *H01P 7/08* | (2006.01) |
| *H03H 7/01* | (2006.01) |
| *H01P 3/16* | (2006.01) |

(52) U.S. Cl.
CPC ............ *H01P 3/16* (2013.01); *H01P 1/20336* (2013.01); *H01P 7/084* (2013.01); *H03H 7/0115* (2013.01)

(58) Field of Classification Search
CPC ......... H01P 1/20345; H01P 7/08; H01P 7/088; H03H 7/0115
USPC ................ 333/219, 235, 204, 205, 175, 185
See application file for complete search history.

(56) References Cited

U.S. PATENT DOCUMENTS

| | | | | |
|---|---|---|---|---|
| 5,479,141 A | * | 12/1995 | Ishizaki et al. | ............... 333/204 |
| 6,191,666 B1 | * | 2/2001 | Sheen | ............... 333/185 |
| 2003/0201847 A1 | * | 10/2003 | Lee et al. | ............... 333/204 |
| 2005/0195046 A1 | * | 9/2005 | Ralph | ............... 333/117 |
| 2005/0200436 A1 | * | 9/2005 | Lee et al. | ............... 333/204 |

FOREIGN PATENT DOCUMENTS

| | | | | |
|---|---|---|---|---|
| EP | 1083621 | * | 9/2000 | ............ H01P 1/203 |
| JP | 3464820 B2 | | 11/2003 | |
| JP | 4291488 B2 | | 4/2009 | |
| JP | 4401586 B2 | | 1/2010 | |
| KR | 2010-0066266 A | | 6/2010 | |

OTHER PUBLICATIONS

Office Action issued on Mar. 24, 2014 in corresponding Korean Patent Application No. 2013-0040613.

(Continued)

*Primary Examiner* — Robert Pascal
*Assistant Examiner* — Gerald Stevens
(74) *Attorney, Agent, or Firm* — Knobbe Martens Olson & Bear LLP

(57) ABSTRACT

A resonance device is disclosed. The resonance device in accordance with an embodiment of the present invention includes: a case including a first ground surface and a second ground surface which face each other; a stacked part formed inside the case by stacking a first conductive layer and a second conductive layer, wherein the first conductive layer is grounded to the first ground surface and the second conductive layer is separated from the first conductive layer without being grounded to the first ground surface; and a transmission layer connecting the second conductive layer to the second ground surface.

12 Claims, 10 Drawing Sheets

(56) References Cited

OTHER PUBLICATIONS

Yang Tao et al, "Compact Combline Bandpass Filter Using LTCC Technology" Microwave and Millimeter Wave Technology 2007, pp. 1-4, Apr. 2007.
Notice of Allowance dated Aug. 3, 2014 regarding corresponding Korean Patent application No. 10-2013-0040613.
Chinese Office Action, dated Nov. 26, 2015, received in corresponding Chinese Patent Application No. 201310192472.7.

\* cited by examiner

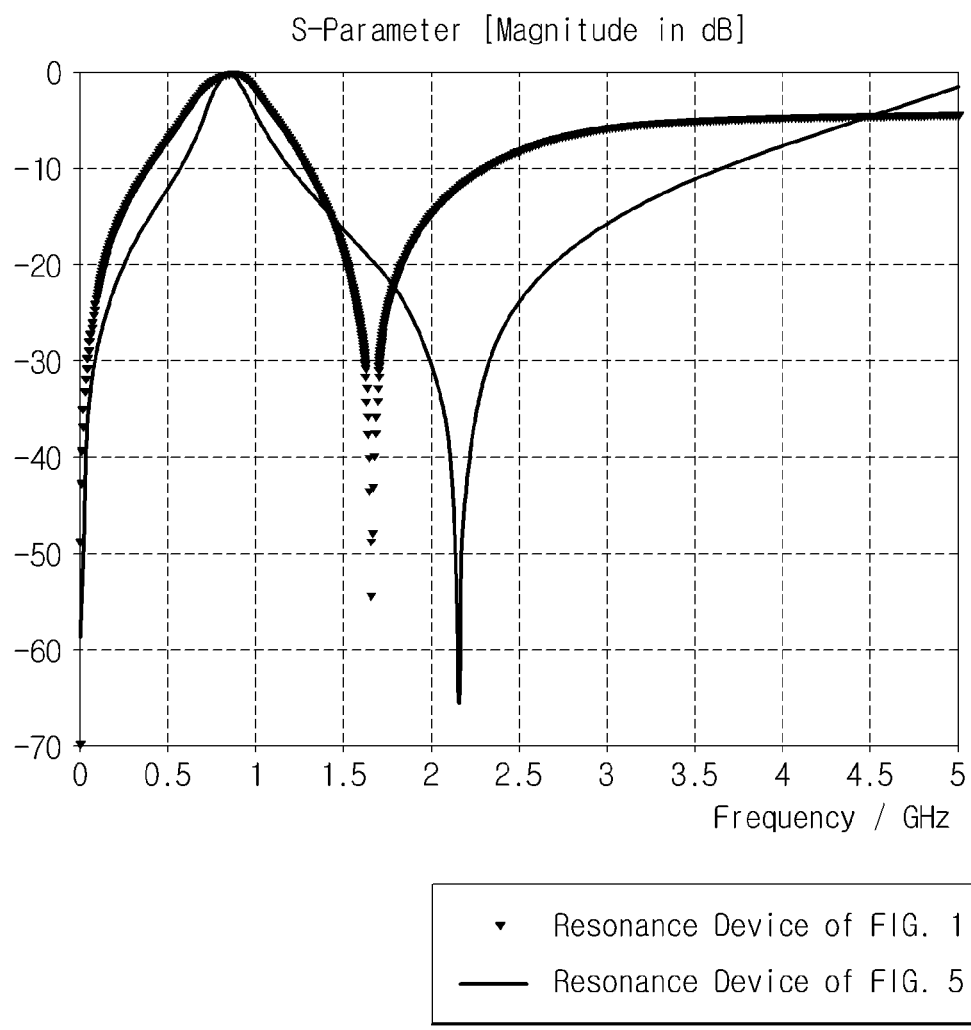

RESONANCE DEVICE

CROSS-REFERENCE TO RELATED APPLICATIONS

This application claims the benefit of Korean Patent Application No. 10-2013-0040613, filed with the Korean Intellectual Property Office on Apr. 12, 2013, the disclosure of which is incorporated herein by reference in its entirety.

BACKGROUND

1. Technical Field

The present invention relates to a resonance device, more specifically to a resonance device having a stacked structure.

2 Background Art

With the recent advancement of wireless communication technologies, communication systems using a microwave band or millimeter wave band as the carrier wave, for example, WLAN, mobile communication systems using WCDMA, LTE, etc., have been increasingly popular. Through the utilization of various wireless communication systems, it has become possible to transmit and receive various data at various locations such as at home or outdoors.

Various RF filters are used for communication devices that are applied in communication systems. RF filters, which function to allow signals in specific predetermined frequency bands to pass, are categorized into low pass filter (LPF), band pass filters (BPF), high pass filters (HPF) and band stop filters (BSF), depending on the filtered frequency bands.

The filters used in communication systems are designed with a distributed constant circuit, rather than a lumped element circuit, in order to process the signals in high frequency bands.

A resonator having a high Q-factor is required in order to realize the narrowband characteristics and good filtering characteristics at the same time in the RF filter. The conventional resonator has been realized in the form of printed circuit board (PCB), dielectric resonator (DR) or mono block.

With the resonator in accordance with the conventional technology and the RF filter using such a resonator, it has been not only difficult to obtain a high Q-factor and reduce the size of the device but also less flexible in designing the device.

SUMMARY

The present invention provides a resonance device that has a higher Q-factor and a smaller size.

The present invention also provides a narrowband pass filter having excellent filtering characteristic, by using the resonance device that has a higher Q-factor and a smaller size.

An aspect of the present invention features a resonance device. The resonance device in accordance with an embodiment of the present invention includes: a case including a first ground surface and a second ground surface which face each other; a stacked part formed inside the case by stacking a first conductive layer and a second conductive layer, wherein the first conductive layer is grounded to the first ground surface and the second conductive layer is separated from the first conductive layer without being grounded to the first ground surface; and a transmission layer connecting the second conductive layer to the second ground surface.

The stacked part can also include a third conductive layer which is separated from the second conductive layer toward an opposite side of the first conductive layer and is grounded to the first ground surface.

The stacked part can also include: a fourth conductive layer which is separated from the first conductive layer toward an opposite side of the second conductive layer and is not grounded to the first ground surface; and a pillar which electrically connects the second conductive layer and the fourth conductive layer with each other.

The stacked part can also include: a third conductive layer which is separated from the second conductive layer toward an opposite side of the first conductive layer and is grounded to the first ground surface; a fourth conductive layer which is separated from the first conductive layer toward an opposite side of the second conductive layer and is not grounded to the first ground surface; a fifth conductive layer which is separated from the third conductive layer toward an opposite side of the second conductive layer and is not grounded to the first ground surface; and a pillar which electrically connects the second conductive layer, the fourth conductive layer and the fifth conductive layer with one another.

An empty space inside the case can be filled with a dielectric substance.

The dielectric substance can be a ceramic having a dielectric constant of 7.8.

The resonance device can also include: an input part through which an input signal is inputted to the stacked part or the transmission layer from an outside of the case; and an output part through which an output signal is outputted to an outside of the case from the stacked part or the transmission layer.

Another aspect of the present invention features a resonance device. The resonance device in accordance with an embodiment of the present invention includes: a case including a first ground surface and a second ground surface which face each other; and a plurality of resonators which are formed inside the case and are separated from one another. Each of the plurality of resonators includes: a stacked part formed by stacking a first conductive layer and a second conductive layer, wherein the first conductive layer is grounded to the first ground surface and the second conductive layer is separated from the first conductive layer without being grounded to the first ground surface; and a transmission layer connecting the second conductive layer to the second ground surface.

BRIEF DESCRIPTION OF THE DRAWINGS

FIG. 10 is a graph showing a test result of comparison of band pass filter performances of a conventional resonance device and a resonance device in accordance with an embodiment of the present invention.

DETAILED DESCRIPTION

Figure 1:
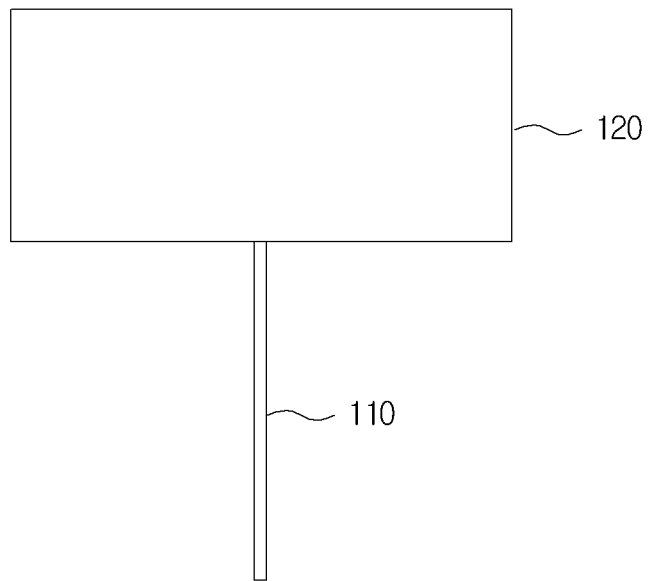
FIG. 1 shows a structure of a conventional microstrip resonator.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

Hereinafter, certain embodiments of the present invention will be described in detail with reference to the accompanying drawings. In describing the present invention, identical reference numerals will be used to represent identical means regardless of the figure number for easier understanding.

FIG. 1 shows a structure of a conventional microstrip resonator 100.

The microstrip resonator 100, which has a general shorted λ/4 resonator structure, is a stepped impedance resonator (SIR) that is constituted with two lines having two different specific impedances, respectively. Generally, a wide conductive plate 120 is shorted, and a narrow line 110 is opened.

Figure 2:
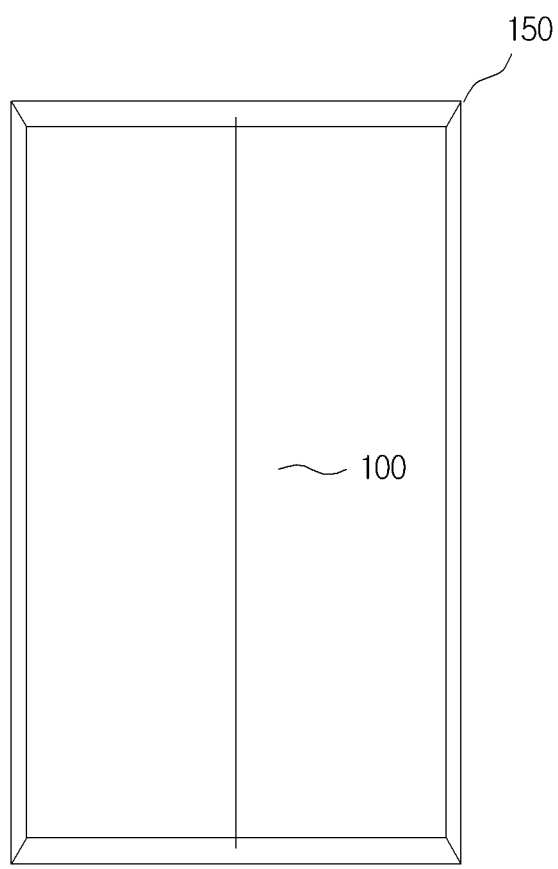
FIG. 2 shows a conventional resonator constituted by installing a microstrip resonator in a conductive case.

FIG. 2 shows a conventional resonator constituted by installing the microstrip resonator 100 in a conductive case 150.

Figure 3:
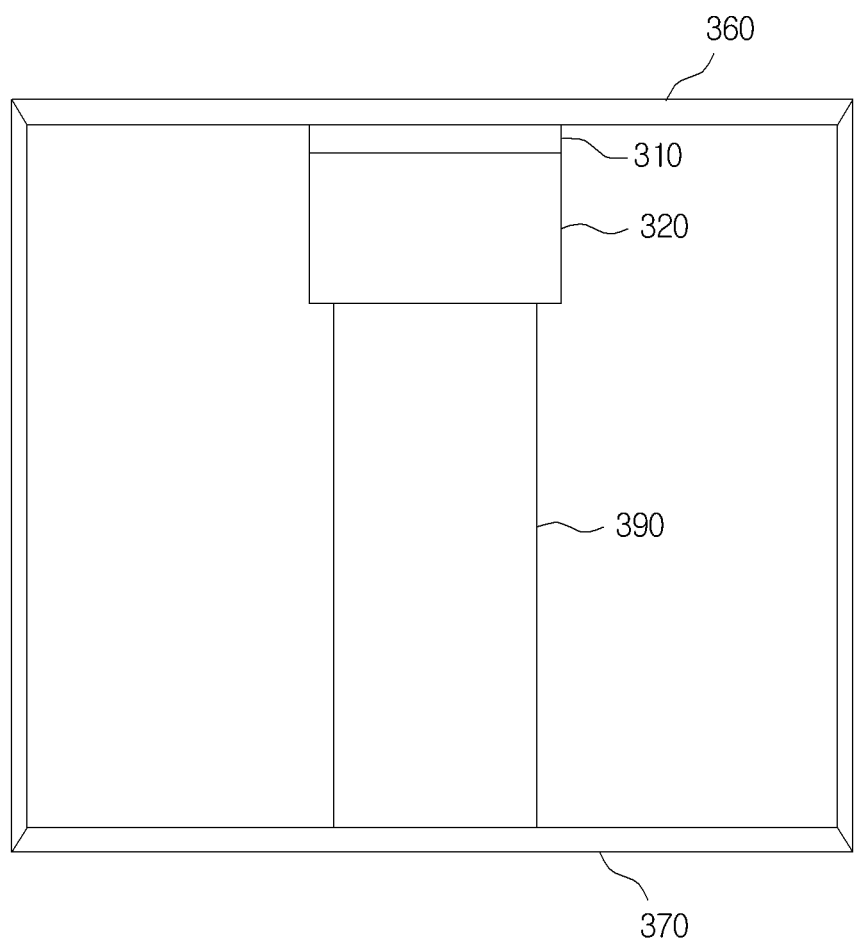
FIGS. 3 and 4 show a structure of a resonance device in accordance with an embodiment of the present invention.
Figure 4:
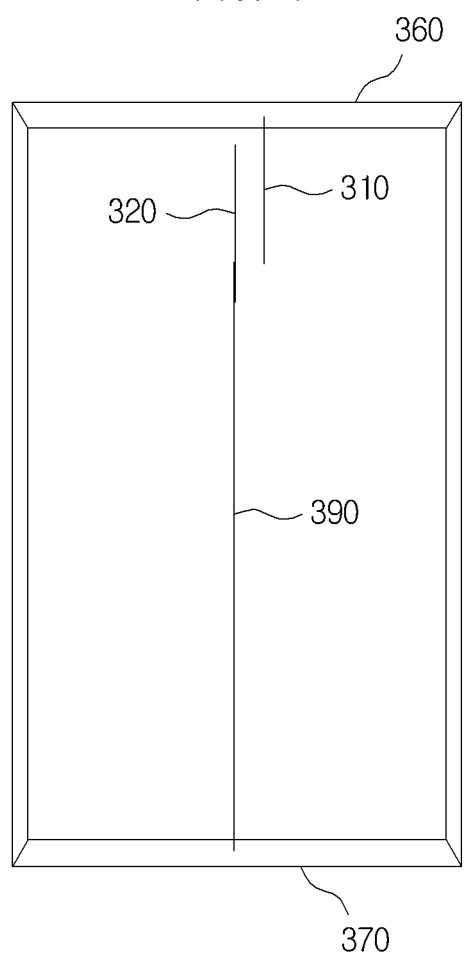

FIGS. 3 and 4 show a structure of a resonance device in accordance with an embodiment of the present invention. FIG. 3 is a top view of a case in which a resonator is installed, and FIG. 4 is a cross-sectional view of the case in which the resonator is installed.

The resonance device in accordance with an embodiment of the present invention includes the case, a stacked part, which is formed inside the case, and a transmission layer.

The case includes a first ground surface 360 and a second ground surface 370 that are placed opposite to each other. The case in accordance with an embodiment of the present invention can include, but not limited to, a hexahedral shape. All surfaces, including the two ground surfaces 360, 370, of the case can be made of a conductive body. The case made of a conductive body can allow one or more resonators formed inside the case to operate without getting affected by an environment outside the case. Specifically, it is possible to prevent an outside environment from affecting the characteristics of the resonators inside the case, by shielding electromagnetic waves that can be generated by currents of other nearby devices or circuits.

The stacked part formed inside the case can be formed by stacking at least two conductive layers. In an example of the stacked part formed by having two conductive layers stacked on each other, the two conductive layers can be constituted with a first conductive layer 310, which is grounded to the first ground surface 360, and a second conductive layer 320, which is not grounded to the first ground surface 360 but separated from the first conductive layer 310. Here, the second conductive layer 320 can be connected with the second ground surface 370 through a transmission layer 390.

The first conductive layer 310, the second conductive layer 320 and the transmission layer 390 that constitute the stacked part have capacitance and inductance. As a result, the resonator constituted with the stacked part and the transmission layer formed inside the case can be approximated to an LC resonance circuit and can function as a band pass filter.

The capacitance that the resonator has can be varied by adjusting the number, shape and/or area of the conductive layers constituting the stacked part, and the inductance that the resonator has can be varied by adjusting the length and area of the transmission layer.

The sizes of the capacitance and inductance of the resonance device can be determined by adjusting the various factors described above. In the case that the resonance device functions as a band pass filter, the pass band of the band pass filter can be determined by the sizes of the capacitance and inductance of the resonator formed inside the case.

In another embodiment of the present invention, the stacked part formed inside the case can further include conductive layers that are separated from one another. The resonator in accordance with another embodiment of the present invention can additionally include a third conductive layer, which is separated from the second conductive layer toward an opposite side of the first conductive layer and is grounded to the first ground surface, in FIG. 4.

In yet another embodiment of the present invention, the resonator can additionally include a fourth conductive layer, which is separated from the first conductive layer toward an opposite side of the second conductive layer and is not grounded to the first ground surface, in FIG. 4. Here, the second conductive layer and the fourth conductive layer, which are not grounded to the first ground surface, can be electrically connected to each other by a pillar.

Figure 5:
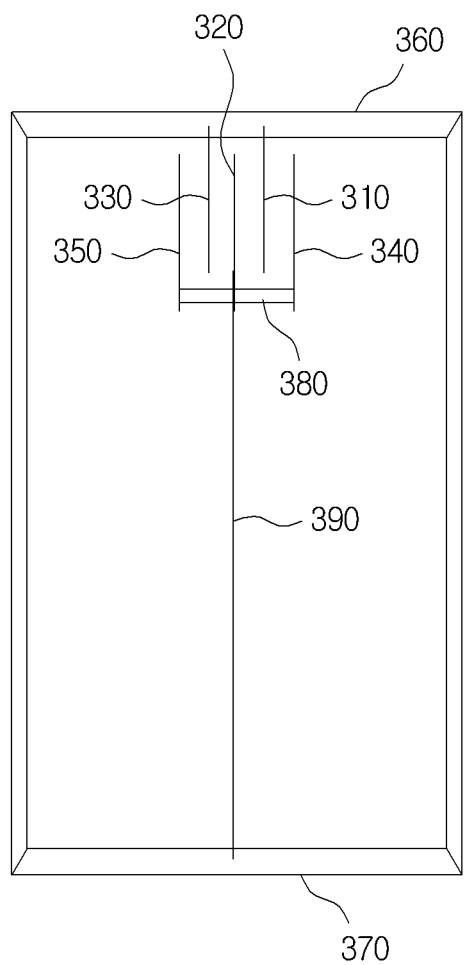
FIGS. 5 and 6 show a resonator constituted by stacking 5 conductive layers in accordance with an embodiment of the present invention.
Figure 6:
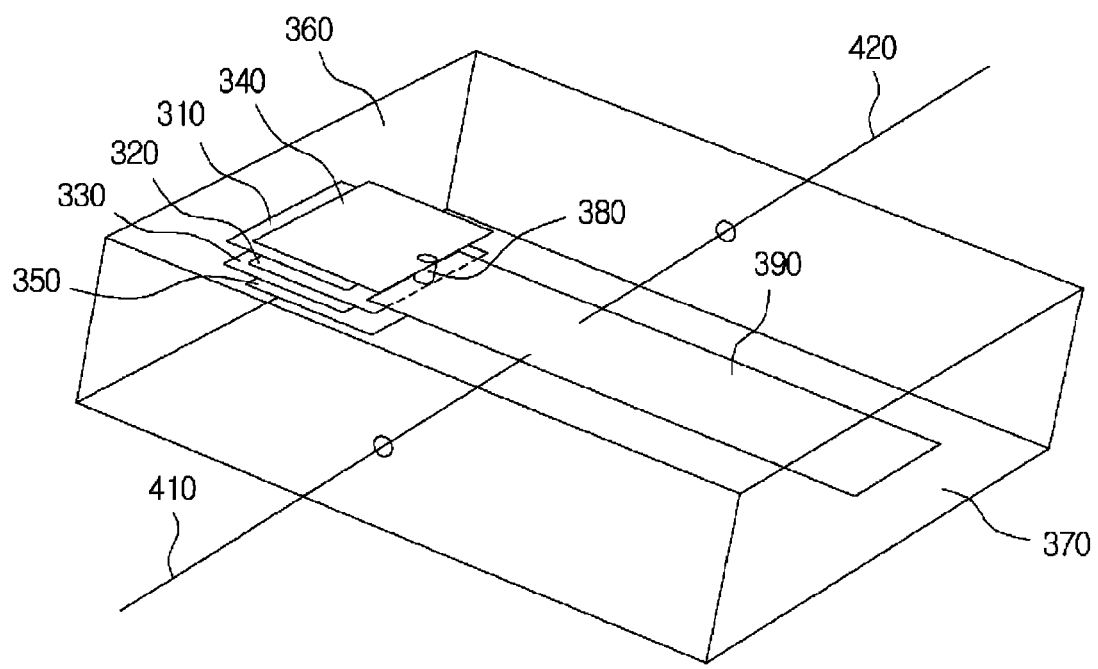

FIGS. 5 and 6 show a resonator constituted by stacking 5 conductive layers in accordance with an embodiment of the present invention.

The stacked part of the resonator in accordance with the embodiment shown in FIG. 4 can further include: a third conductive layer 330, which is separated from the second conductive layer 320 toward an opposite side of the first conductive layer 310 and which is grounded to the first ground surface 360; a fourth conductive layer, which is separated from the first conductive layer 310 toward and opposite side of the second conductive layer 320 and which is not grounded to the first ground surface 360; a fifth conductive layer 350, which is separated from the third conductive layer 330 toward an opposite side of the second conductive layer 320 and which is not grounded to the first ground surface 360; and a pillar 380, which electrically connects the second conductive layer 320, the fourth conductive layer 340 and the fifth conductive layer 350 with one another.

The resonance device in accordance with each of the above-described embodiments can have an empty space inside the case filled with a dielectric substance, of which one example can be a ceramic having a dielectric constant of 7.8.

The stacked part or the transmission layer of the resonance device can further include an input part 410, to which an input signal is inputted from an outside of the case, and an output part 420, from which an output signal is outputted from the stacked part or the transmission layer to the outside of the case. The input part 410 allows the signal to be inputted to the stacked part or the transmission layer without being grounded to any ground surface of the case, and the output part 420 also allows the signal outputted from the stacked part or the transmission part to be not grounded to any ground surface of the case.

The input signal inputted through the input part 410 can include signals of various frequency bands, and the output signal includes signals of a particular frequency band when the resonance device in accordance with an embodiment of the present invention functions as a band pass filter that allows the particular frequency band to pass. That is, signals corresponding to a resonance frequency band, which is determined by factors such as the number and shape of conductive layers forming the stacked part as described above, the separation distance between the conductive layers, and the length and area of the transmission layer, can be only included in the output signal.

Figure 7:
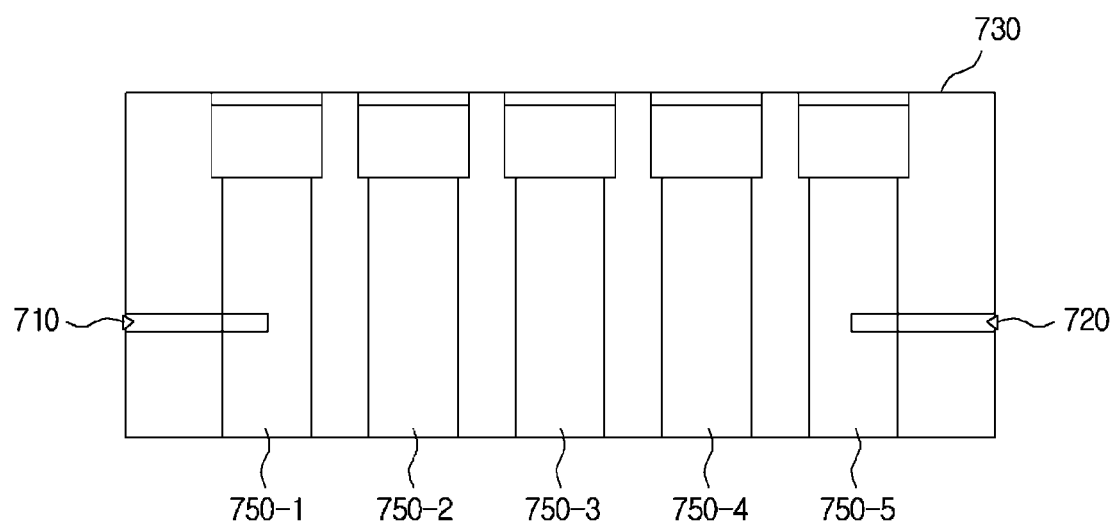
FIG. 7 shows a resonance device having a plurality of resonators included in one case in accordance with another embodiment of the present invention.

FIG. 7 shows a resonance device having a plurality of resonators included in one case in accordance with another embodiment of the present invention.

The resonance device including a plurality of resonators can include a case 730, which includes a first ground surface and a second ground surface that face each other, and a plurality of resonators 750-1, 750-2, 750-3, 750-4, 750-5, which are formed inside the case. Here, each of the plurality of resonators can be any one of the resonators described with reference to FIGS. 3 to 6. Although the resonance device shown in FIG. 7 includes 5 resonators 750-1, 750-2, 750-3, 750-4, 750-5, the number of resonators included in the resonance device is not restricted what is described herein and can be varied as necessary. The greater the number of resonators included in the resonance device, the more effective the characteristics of the pass band can be improved as a band pass filter. That is, it becomes possible to obtain a higher Q-factor, a better shield property, a wider filter band and a relatively lower insertion loss. The resonance device including the plurality of resonators 750-1, 750-2, 750-3, 750-4, 750-5 in accordance with the present embodiment can also include an input part 710 and an output part 720.

Figure 8:
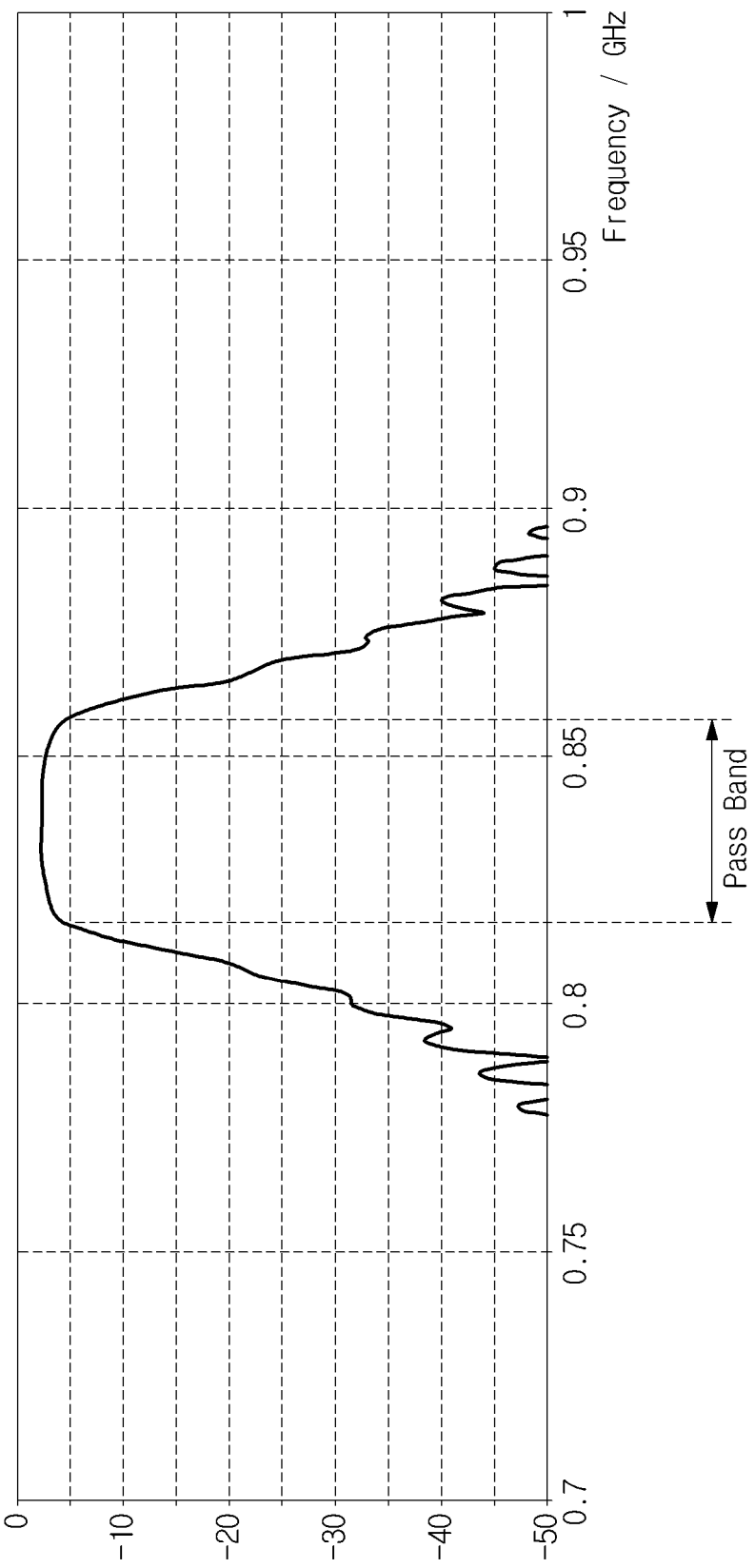
FIGS. 8 and 9 are graphs showing band pass characteristics of a resonance device in accordance with an embodiment of the present invention.
Figure 9:
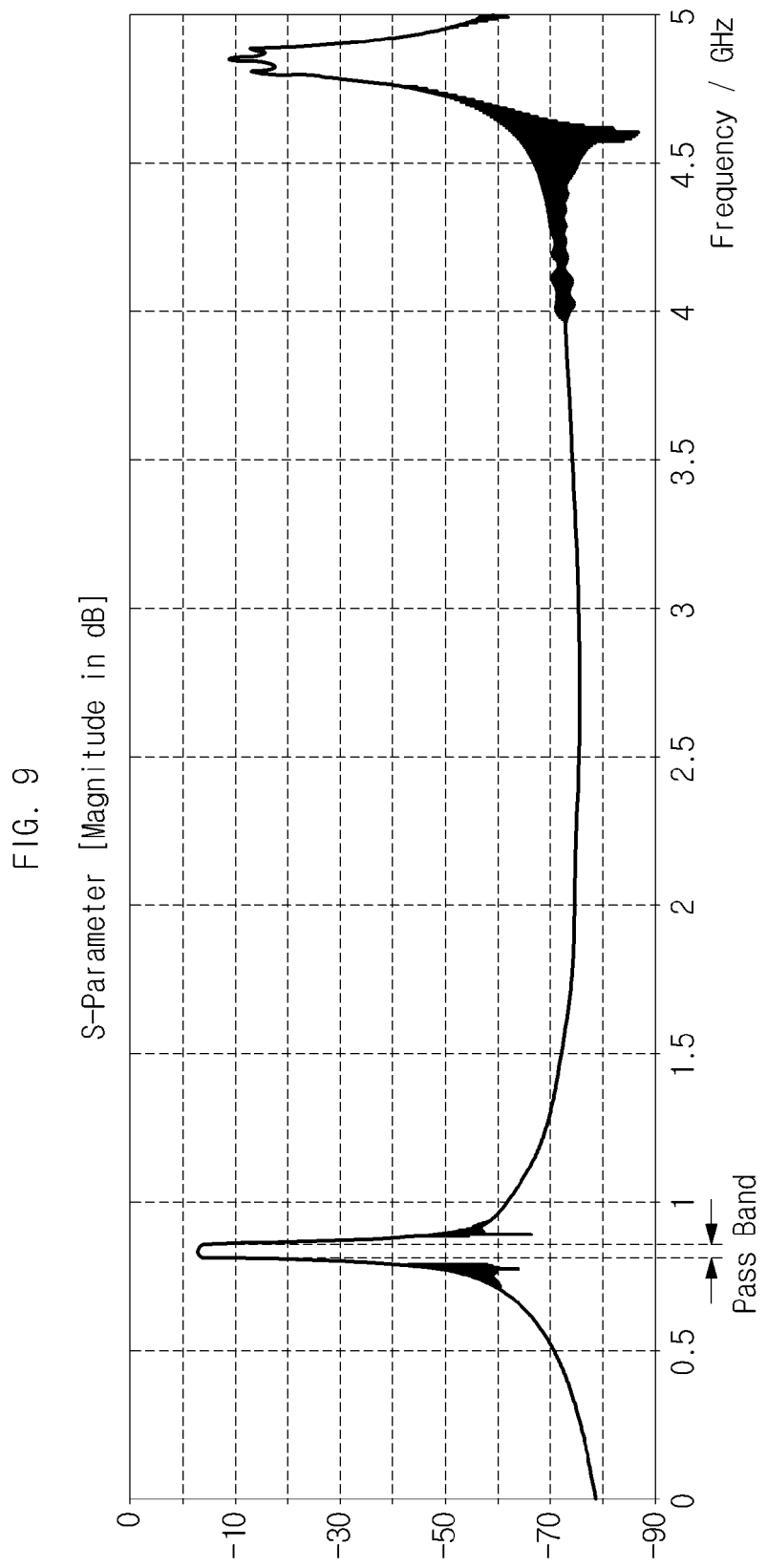

FIGS. 8 and 9 are graphs showing band pass characteristics of a resonance device in accordance with an embodiment of the present invention.

FIGS. 8 and 9 show a result of a test to which the resonance device shown in FIG. 7 in accordance with an embodiment of the present invention is used. FIG. 8 shows characteristics in a pass band, and FIG. 9 shows characteristics in an entire band. Referring to FIG. 8, it can be seen that the pass band of 800 MHz has a low loss and a relatively uniform attenuation. Moreover, as sharp attenuation characteristics are shown in bands outside the pass band, it can be seen that the resonance device in accordance with an embodiment of the present invention can be used as a narrowband pass filter.

Referring to FIG. 9, a parasitic component is formed in a band exceeding 4.5 GHz, and an excellent function is shown as a band pass filter that filters signals outside the 800 MHz band. This shows that when the resonance device in accordance with an embodiment of the present invention is used as a band pass filter in a mobile communication system, signals in frequency bands outside the pass band can be filtered within the frequency bands used in the mobile communication system.

FIG. 10 is a graph showing a test result of comparison of band pass filter performances between a conventional resonance device and the resonance device in accordance with an embodiment of the present invention.

In order to compare a resonance device having the conventional resonator shown in FIG. 1 with the resonance device in accordance with an embodiment of the present invention, identical hexadrons (12 mm×12 mm×3 mm) surrounded by conductive ground surfaces are filled with a ceramic having the dielectric constant of 7.8. The empty space inside the case is filled with the ceramic having the dielectric constant of 7.8, and a conductive substance of $4 \times 10^7$ S/m is used for conductive surfaces of the case, conductive layers of the stacked part and transmission layers.

Insertion loss characteristics (S21 characteristics) of S-parameters that are checked by feeding power to both resonance devices in a same method are shown in FIG. 10. It can be seen that the resonance device in accordance with an embodiment of the present invention has a narrower width than the conventional resonance device in the identical resonance frequency (800 MHz) band.

Main characteristics of both resonance devices are compared in the following table.

|  | $f_0$ [GHz] | Q @ $f_0$ | $2f_0$ [GHz] | Q @ $2f_0$ | Dimension [mm$^3$] |
|---|---|---|---|---|---|
| Resonance Device of FIG. 1 | 0.836 | 135 | 5.01 | 483 | 12 × 9.5 × 0.012 |
| Resonance Device of FIG. 5 | 0.836 | 302 | 4.12 | 169 | 12 × 3.8 × 0.8 |

As it can be seen in the table, a higher Q-factor (from 135 to 302) is obtained at the resonance frequency of $f_0$, and the width of the resonance device in accordance with an embodiment of the present invention is decreased to 3.8 mm from 9.5 mm although the height is slightly increased to 0.8 mm due to the stacked structure. Accordingly, it can be seen that the resonance device in accordance with an embodiment of the present invention can realize an excellent band pass filter having a higher Q-factor and a smaller size.

The embodiments described above include a wide variety of forms. Although it is not possible to describe all possible combinations to illustrate the variety of forms, it shall be appreciated by those who are ordinarily skilled in the art to which the present invention pertains thatH other combinations are possible. Therefore, it shall be appreciated that the present invention encompasses all other substitutions, modifications and permutations that belong to the claims appended below.

What is claimed is:
1. A resonance device, comprising:
a case including a first ground surface and a second ground surface which face each other;
a stacked part formed inside the case by stacking a first conductive layer and a second conductive layer, the first conductive layer being grounded to the first ground surface, the second conductive layer being separated from the first conductive layer without being grounded to the first ground surface; and a transmission layer connecting the second conductive layer to the second ground surface, wherein the stacked part further comprises:

a fourth conductive layer which is separated from the first conductive layer toward an opposite side of the second conductive layer without being grounded to the first ground surface; and a pillar configured to electrically connect the second conductive layer and the fourth conductive layer with each other, wherein the first conductive layer has a planar shape, wherein the first conductive layer has first and second ends opposing each other, wherein the first end is interposed between the second and fourth conductive layers, wherein the second end of the first conductive layer is in direct physical contact with the first ground surface, and wherein the pillar is arranged to be parallel with the first ground surface and the second ground surface and is connected with the second ground surface through the second conductive layer and the transmission layer.

2. The resonance device of claim 1, wherein the stacked part further comprises a third conductive layer which is separated from the second conductive layer toward an opposite side of the first conductive layer and is grounded to the first ground surface.

3. The resonance device of claim 1, wherein an empty space inside the case is filled with a dielectric substance.

4. The resonance device of claim 3, wherein the dielectric substance is a ceramic having a dielectric constant of 7.8.

5. The resonance device of claim 1, further comprising:
an input part through which an input signal is inputted to the stacked part or the transmission layer from an outside of the case; and
an output part through which an output signal is outputted to the outside of the case from the stacked part or the transmission layer.

6. The resonance device of claim 1, wherein the stacked part further comprises a third conductive layer substantially parallel with the first conductive layer and in direct physical contact with the first ground surface.

7. The resonance device of claim 1, wherein the transmission layer has a first end that is in direct physical contact with the second ground surface.

8. The resonance device of claim 7, wherein the transmission layer has a second end that is interposed between the first and fourth conductive layers, and wherein the second end of the transmission layer does not directly contact the first and fourth conductive layers.

9. The resonance device of claim 1, wherein the transmission layer has a length larger than any of that of the first, second and fourth conductive layers.

10. The resonance device of claim 1, wherein the transmission layer has a width smaller than any of that of the first, second and fourth conductive layers.

11. A resonance device, comprising:
a case including a first ground surface and a second ground surface which face each other;
a stacked part formed inside the case by stacking a first conductive layer and a second conductive layer, the first conductive layer being grounded to the first ground surface, the second conductive layer being separated from the first conductive layer without being grounded to the first ground surface; and
a transmission layer connecting the second conductive layer to the second ground surface, wherein the stacked part further comprises:

a third conductive layer which is separated from the second conductive layer toward an opposite side of the first conductive layer and is grounded to the first ground surface;

a fourth conductive layer which is separated from the first conductive layer toward an opposite side of the second conductive layer without being grounded to the first ground surface;

a fifth conductive layer which is separated from the third conductive layer toward the opposite side of the second conductive layer without being grounded to the first ground surface; and a pillar configured to electrically connect the second conductive layer, the fourth conductive layer and the fifth conductive layer with one another, wherein the first conductive layer has a planar shape, wherein the first conductive layer has first and second ends opposing each other, wherein the first end is interposed between the second and fourth conductive layers, wherein the second end of the first conductive layer is in direct physical contact with the first ground surface, and wherein the pillar is arranged to be parallel with the first ground surface and the second ground surface and is connected with the second ground surface through the second conductive layer and the transmission layer.

12. A resonance device, comprising:
a case including a first ground surface and a second ground surface which face each other; and
a plurality of resonators which are formed inside the case and are separated from one another, wherein each of the plurality of resonators comprises:

a stacked part formed by stacking a first conductive layer and a second conductive layer, the first conductive layer being grounded to the first ground surface, the second conductive layer being separated from the first conductive layer without being grounded to the first ground surface; and a transmission layer connecting the second conductive layer to the second ground surface, wherein the stacked part further comprises:

a fourth conductive layer which is separated from the first conductive layer toward an opposite side of the second conductive layer without being grounded to the first ground surface; and a pillar configured to electrically connect the second conductive layer and the fourth conductive layer with each other, wherein the first conductive layer has a planar shape, wherein the first conductive layer has first and second ends opposing each other, wherein the first end is interposed between the second and fourth conductive layers, wherein the second end of the first conductive layer is in direct physical contact with the first ground surface, and wherein the pillar is arranged to be parallel with the first ground surface and the second ground surface and is connected with the second ground surface through the second conductive layer and the transmission layer.

* * * * *